US007420492B2

(12) United States Patent
Kim et al.

(10) Patent No.: US 7,420,492 B2
(45) Date of Patent: Sep. 2, 2008

(54) CURRENT RANGE CONTROL CIRCUIT, DATA DRIVER, AND ORGANIC LIGHT EMITTING DISPLAY

(75) Inventors: Yang Wan Kim, Seoul (KR); Oh Kyong Kwon, Seoul (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/282,313

(22) Filed: Nov. 18, 2005

(65) Prior Publication Data

US 2006/0125808 A1 Jun. 15, 2006

(30) Foreign Application Priority Data

Nov. 23, 2004 (KR) ..................... 10-2004-0096378

(51) Int. Cl.
*H03M 1/00* (2006.01)

(52) U.S. Cl. ...................................... 341/135; 341/130

(58) Field of Classification Search .......... 341/130–166
See application file for complete search history.

(56) References Cited

U.S. PATENT DOCUMENTS

| | | | | |
|---|---|---|---|---|
| 6,617,796 | B2 * | 9/2003 | Sasaki et al. | 315/169.1 |
| 6,788,231 | B1 * | 9/2004 | Hsueh | 341/135 |
| 2003/0040149 | A1 | 2/2003 | Kasai | |
| 2005/0110726 | A1 * | 5/2005 | Shin | 345/76 |
| 2005/0264228 | A1 * | 12/2005 | Kim | 315/169.3 |
| 2005/0264493 | A1 * | 12/2005 | Shin | 345/76 |
| 2005/0264499 | A1 * | 12/2005 | Kim et al. | 345/76 |
| 2006/0050037 | A1 * | 3/2006 | Maki | 345/89 |
| 2006/0139263 | A1 * | 6/2006 | Choi et al. | 345/76 |
| 2006/0139264 | A1 * | 6/2006 | Choi et al. | 345/76 |

FOREIGN PATENT DOCUMENTS

| | | |
|---|---|---|
| CN | 1402208 A | 3/2003 |
| JP | 2003-255898 | 9/2003 |
| JP | 2003-288051 | 10/2003 |

OTHER PUBLICATIONS

China Office action dated August 31, 2007, for CN 2005101248560 with English translation.
Patent Abstracts of Japan, Publication No. 2003-255898, dated Sep. 10, 2003, in the name of Shinji Kitahara et al.
Patent Abstracts of Japan, Publication No. 2003-288051, dated Oct. 10, 2003, in the name of Atsushi Maede et al.

* cited by examiner

*Primary Examiner*—Lam T Mai
(74) *Attorney, Agent, or Firm*—Christie, Parker & Hale, LLP

(57) ABSTRACT

A current range control circuit for a data driver in an organic light emitting display. The data driver includes a shift register for outputting a latch control signal, a data latch for sequentially receiving video data and to output the video data in parallel, a digital to analog converter for converting the outputs of the data latch into analog currents, and the current range control circuit for outputting data currents corresponding to the analog currents and controlling the data current range using current range control signals. Because it is possible to control the range of the data currents output from the data driver, it is possible to use the data driver in various pixel circuits or electroluminescent devices by changing the current range control signals, and to make the drain voltages of the transistors that form a current mirror equal to each other to obtain the desired current values.

11 Claims, 2 Drawing Sheets

CURRENT RANGE CONTROL CIRCUIT, DATA DRIVER, AND ORGANIC LIGHT EMITTING DISPLAY

CROSS-REFERENCE TO RELATED APPLICATION

This application claims priority to and the benefit of Korean Patent Application No. 2004-96378, filed on Nov. 23, 2004, in the Korean Intellectual Property Office, the entire content of which is incorporated herein by reference.

BACKGROUND

1. Field of the Invention

The present invention relates to a current range control circuit, a data driver, and an organic light emitting display, and more particularly to, a current range control circuit, a data driver, and an organic light emitting display capable of controlling the range of the output currents of the data driver.

2. Discussion of Related Art

Recently, various flat panel displays of lower weight and volume than the traditional cathode ray tubes (CRT) have been developed. Flat panel displays include liquid crystal displays (LCD), field emission displays (FED), plasma display panels (PDP), and organic light emitting displays.

Among the flat panel displays, the organic light emitting displays are spontaneous emission devices that emit light by re-combination of electrons and holes. The organic light emitting display may be referred to as an organic electroluminescent display. Compared to a passive electroluminescent device that requires an additional light source, such as an LCD, the organic light emitting display has high response speed more similar to the CRT.

The organic light emitting display may be driven either by a passive matrix method or an active matrix method. In the passive matrix method, an anode and a cathode are formed to intersect and a line is selected to be driven. In the active matrix method, the amount of current that flows through an electroluminescent device is controlled by an active device. A thin film transistor (TFT) is mainly used as the active device. The active matrix method is complicated, while having the advantages of low power consumption and long emission time.

The programming methods of the organic light emitting display are divided into a voltage programming method and a current programming method. In the voltage programming method, a data driver outputs a voltage corresponding to a data signal, a capacitor that is part of a pixel stores voltage corresponding to the output voltage, and an electroluminescent device emits light in response to the stored voltage. In the voltage programming method, it is possible to use the data driver used for the LCD as is. However, it is difficult to obtain a uniform image due to variation between the threshold voltage and mobility of the various TFTs used as the active device of the pixel circuit.

In the current programming method, the data driver outputs currents corresponding to the data signals, the capacitor built in the pixel stores the voltage corresponding to the output current, and the electroluminescent device emits light in response to the stored voltage. In the current programming method, it is possible to easily compensate for the variation of the threshold voltage and mobility of the TFTs and to thus obtain a uniform screen.

On the other hand, in the data driver of the current programming method, the range of the data currents may vary with the pixel circuit. In the case of the pixel circuit that transmits current whose magnitude is equal to the magnitude of the data currents, the required range of the data currents is not large. However, when the data currents are M times the current that flows through the electroluminescent device by using an M:1 current mirror, the range of the data currents is large. Also, because luminous efficiency varies with the type of the electroluminescent device, the required range of the data currents may vary. As described above, because the required range of the data currents varies with the type of the pixel circuit or the type of the electroluminescent device, a different data driver must be designed whenever the pixel circuit or the electroluminescent device change.

SUMMARY OF THE INVENTION

Accordingly, the present invention provides a current range control circuit, a data driver, and an organic light emitting display capable of controlling the range of data current.

The foregoing and/or other aspects of the present invention are achieved by providing a data driver including a shift register for outputting a latch control signal in response to a clock signal and a synchronizing signal, a data latch for sequentially receiving video data in accordance with the latch control signal to output the video data in parallel, a digital to analog converter for converting the outputs of the data latch into analog currents to output the analog currents, and a current range control circuit for outputting data currents that are corresponding to the outputs from the digital to analog converter and whose range is controlled in accordance with current range control signals.

According to another aspect of the present invention, there is provided a organic light emitting display including a scan driver for sequentially applying scan signals to a plurality of scan lines, a data driver for applying data currents to a plurality of data lines so that the range of the data currents is controlled by the current range control signals, and a pixel portion for displaying images in accordance with the scan signals applied to the plurality of scan lines and the data currents applied to the plurality of data lines.

According to yet another aspect of the present invention, there is provided a current range control circuit including a current mirror circuit including a first transistor and a plurality of second transistors coupled to the first transistor in the form of a current mirror and a switching circuit for selectively transmitting the currents output from the drains of the plurality of second transistors in accordance with the current range control signal, summing up the transmitted currents, and outputting the currents as data currents.

DETAILED DESCRIPTION

Figure 1:
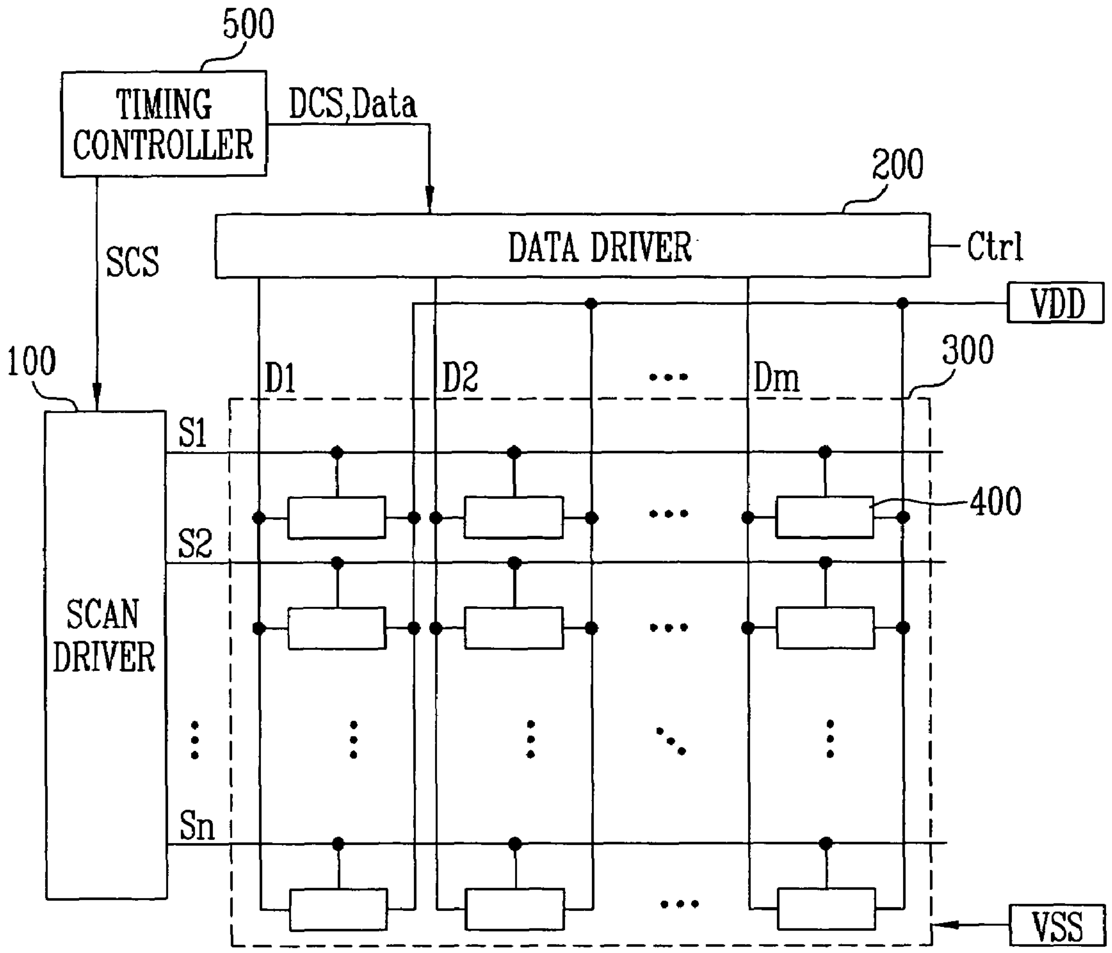
FIG. 1 illustrates an organic light emitting display according to an embodiment of the present invention.

FIG. 1 illustrates an organic light emitting display according to an embodiment of the present invention. Referring to FIG. 1, the organic light emitting display includes a scan driver 100, a data driver 200, a pixel portion 300, and a timing controller 500.

The scan driver 100 drives scan lines S1 to Sn. The scan driver 100 generates scan signals in response to scan driver control signals SCS and sequentially supplies the generated scan signals to the scan lines S1 to Sn.

The data driver 200 drives data lines D1 to Dm. The data driver 200 generates data currents in response to data driver control signals DCS and video data Data and supplies the generated data currents to the data lines D1 to Dm. The range of the output currents of the data driver 200 may be controlled in accordance with current range control signals Ctrl.

The pixel portion 300 includes a plurality of pixels 400 defined by the scan lines S1 to Sn and the data lines D1 to Dm. Also, the pixel portion 300 receives a first power source voltage VDD and a second power source voltage VSS from the outside. The first power source voltage VDD and the second power source voltage VSS are transmitted to the pixels 400. Each of the pixels 400 displays an image corresponding to the data current supplied to that pixel.

The timing controller 500 supplies the scan driver control signals SCS to the scan driver 100 and supplies the data driver control signals DCS and the video data Data to the data driver.

Figure 2:
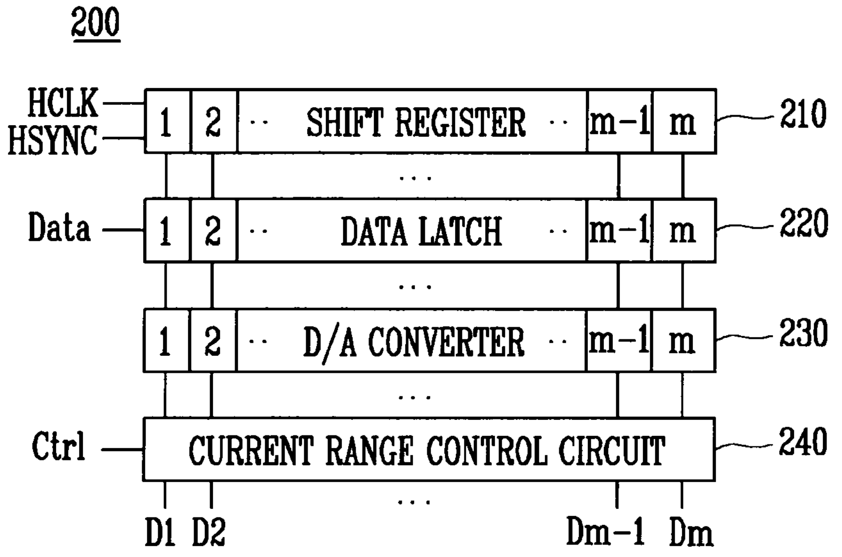
FIG. 2 illustrates an example of a data driver used for the organic light emitting display of FIG. 1.

FIG. 2 illustrates an example of the data driver used for the organic light emitting display of FIG. 1. The data driver 200 includes a shift register 210, a data latch 220, a digital to analog (D/A) converter 230, and a current range control circuit 240.

The shift register 210 controls the data latch 220 in response to a horizontal clock signal HCLK and a horizontal synchronizing signal HSYNC. The horizontal clock signal HCLK and the horizontal synchronizing signal HSYNC are included in the data driver control signals DCS of FIG. 1.

The data latch 220 sequentially receives the video data Data to output the video data Data to the D/A converter 230 in parallel. The data latch 220 is controlled by the control signals output from the shift register 210. Each video data Data may include blue, green, and red video data or blue, green, red, and white video data. The data latch 220 may include a sampling latch (not shown) for sequentially receiving the video data Data in accordance with the control signals output from the shift register 210 and to output the video data Data in parallel. The data latch 220 also includes a holding latch (not shown) for receiving the video data Data output from the sampling latch in parallel to maintain the video data Data for one frame.

The D/A converter 230 converts the signals output from the data latch 220 in parallel into analog currents to output the analog currents.

The current range control circuit 240 outputs the data currents that are received from the D/A converter 230 to the data lines D1 to Dm. As mentioned before, the range of these data currents is controlled in accordance with the current range control signals Ctrl, The values of the currents output from the current range control circuit 240 are preferably proportional to the values of the currents output from the D/A converter 230 and the proportionality constant is determined by the current range control signals Ctrl. For example, the current range control circuit 240 may be designed so that currents twice the currents output from the D/A converter 230 are output when the current range control signals Ctrl correspond to a first mode, that currents 1.5 times the currents output from the D/A converter 230 are output when the current range control signals Ctrl correspond to a second mode, that currents equal to the currents output from the D/A converter 230 are output when the current range control signals Ctrl correspond to a third mode, and that currents 0.5 times the currents output from the D/A converter 230 are output when the current range control signals Ctrl correspond to a fourth mode. Therefore, the range of data currents are proportionally increased and decreased by the current range control signals.

Therefore, the data driver 200 of FIG. 2 outputs the data currents corresponding to the video data Data to the data lines D1 to Dm with the range of the data currents controlled.

Figure 3:
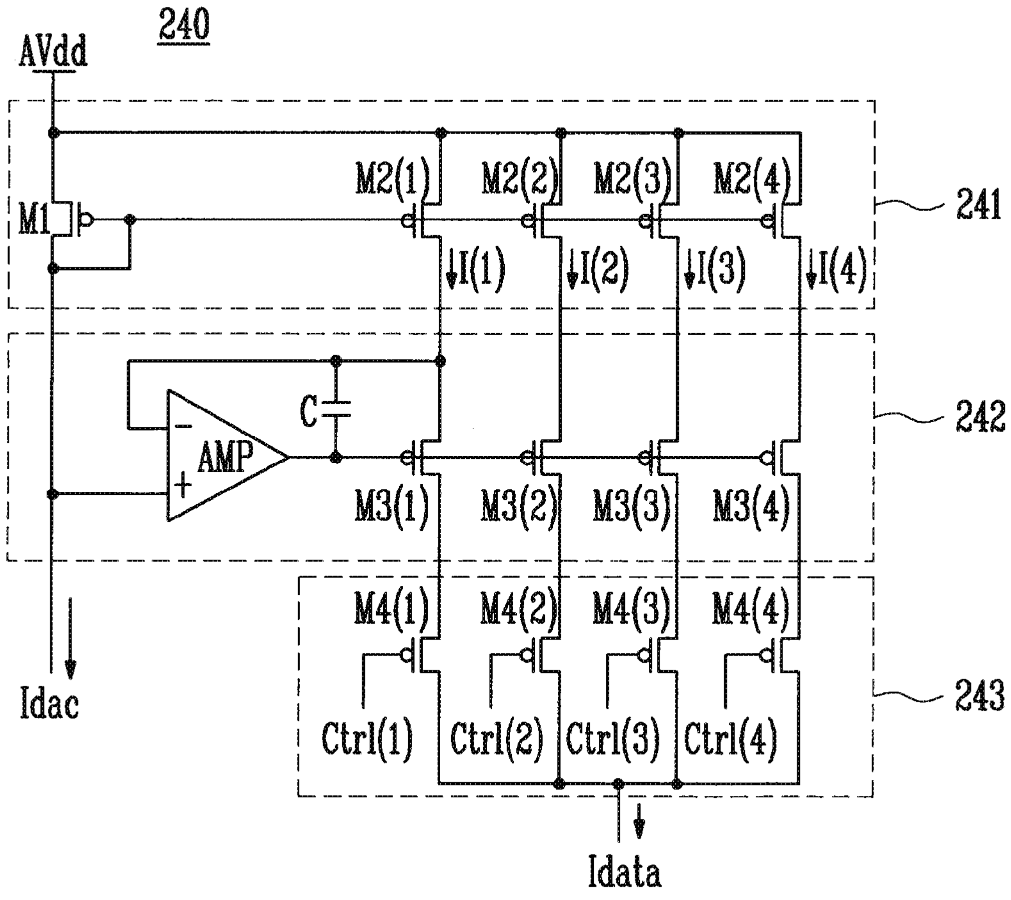
FIG. 3 illustrates an example of a current range control circuit used for the data driver of FIG. 2.

FIG. 3 illustrates an example of the current range control circuit used for the data driver of FIG. 2. The current range control circuit 240 includes a current mirror circuit 241, a negative feedback circuit 242, and a switching circuit 243.

The current mirror circuit 241 includes a first transistor M1 and a plurality of second transistors M2(1), M2(2), M2(3), M2(4) coupled to the first transistor M1 in the form of a current mirror. An analog first power source voltage Avdd is applied to the source of the first transistor M1. The drain and gate of the first transistor M1 are electrically coupled to each other. A current Idac output from the D/A converter is applied to the drain of the first transistor M1. The analog first power source voltage Avdd is applied to the sources of the plurality of second transistors M2(1) to M2(4). The gates of the plurality of second transistors M2(1) to M2(4) are electrically coupled to the gate of the first transistor M1. Each of the plurality of second transistors M2(1) to M2(4) forms a current mirror together with the first transistor M1. Therefore, the currents I(1), I(2), I(3), I(4) that flow through the plurality of second transistors M2(1) to M2(4) are proportional to the current Idac that flows through the first transistor M1. The ratio by which the currents I(1), I(2), I(3), I(4) are proportional to the current Idac is determined by the width to length ratio of the channels of the plurality of second transistors M2(1) to M2(4) and the width to length ratio of the channels of the first transistor M1.

Therefore, the current mirror circuit 241 transmits the plurality of currents I(1) to I(4) proportionate to the current Idac that flows through the first transistor M1 to the switching circuit 243.

The negative feedback circuit 242 includes a plurality of third transistors M3(1), M3(2), M3(3), M3(4), an operational amplifier AMP, and a capacitor C. The positive (+) input port of the operational amplifier AMP is coupled to the drain of the first transistor M1. The negative (−) input port of the operational amplifier AMP is coupled to the drain of one of the transistors among the plurality of second transistors M2(1) to M2(4). The output port of the operational amplifier AMP is coupled to the gates of the plurality of third transistors M3(1) to M3(4). The sources of the plurality of third transistors M3(1), M3(2), M3(3), M3(4) are coupled to the drains of the plurality of second transistors M2(1), M2(2), M2(3), M2(4), respectively. The drains of the plurality of third transistors M3(1) to M3(4) are coupled to the switching circuit 243. The capacitor C is coupled to the output port and negative (−) input port of the operational amplifier AMP and removes the high frequency noise of the outputs of the operational amplifier AMP. The negative feedback circuit 242 forms a negative feedback loop to make the voltage of the drain of the first transistor M1 equal to the voltage of the drains of the plurality of second transistors M2(1) to M2(4). When the voltage of the drain of one transistor among the plurality of second transistors M2(1) to M2(4) is larger than the voltage of the drain of the first transistor M1, the voltage of the output port of the operational amplifier AMP is reduced. Therefore, the current driving ability of the plurality of third transistors M3(1) to M3(4) whose gates are coupled to the output port of the operational amplifier AMP deteriorates. As a result of the negative feedback, the voltage of the drains of the plurality of second transistors M2(1) to M2(4) is reduced. Because the currents that flow through the transistors are affected by the voltage between drains and sources as well as the voltage between gates and sources, when the voltage of the drains of the plurality of second transistors M2(1) to M2(4) is made equal to the voltage of the drain of the first transistor M1, it is possible to make the currents that flow through the plurality of second transistors M2(1) to M2(4) equal to or proportionate to the current that flows through the first transistor M1. In the embodiment shown in FIG. 3, the negative feedback circuit 242 is extra. Even when the plurality of second transistors M2(1) to M2(4) are directly coupled to the switching circuit 243, without the negative feedback circuit 242, the current range control circuit 240 operates normally.

The switching circuit 243 includes a plurality of fourth transistors M4(1), M4(2), M4(3), M4(4). The sources of the plurality of fourth transistors M4(1) to M4(4) are coupled to the negative feedback circuit 242 or the current mirror circuit 241 so that the plurality of fourth transistors M4(1) to M4(4) receive the currents I(1) to I(4) output from the current mirror circuit 241. Current range control signals Crtl(1) to Crtl(4) are applied to the gates of the plurality of fourth transistors M4(1) to M4(4) so that the plurality of fourth transistors M4(1) to M4(4) may selectively transmit the currents I(1) to I(4) received in accordance with the current range control signals Ctrl(1) to Ctrl(4). The drains of the plurality of fourth transistors M4(1) to M4(4) are coupled to one another to add the transmitted currents together and output data currents Idata. Therefore, the switching circuit 243 selectively transmits the currents output from the current mirror circuit 241 in accordance with the current range control signals Ctrl(1) to Ctrl(4) and adds together the transmitted currents to output the data currents Idata. A low level voltage is applied to the gate of one transistor among the plurality of fourth transistors M4(1) to M4(4) so that this one transistor is always turned on and that the current range control signals Ctrl are applied only to the remaining transistors.

The widths of the channels of the plurality of second transistors M2(1) to M2(4) are preferably the same and the lengths of the channels of the plurality of second transistors M2(1) to M2(4) are preferably the same. Also, the widths of the channels of the plurality of third transistors M3(1) to M3(4) are the same and the lengths of the channels of the plurality of third transistors M3(1) to M3(4) are the same. Therefore, the current range control circuit 240 can easily control the range of the data currents Idata. The voltage of the drains of the plurality of second transistors M2(1) to M2(4) is made equal to the voltage of the drain of the first transistor M1 using the plurality of third transistors M3(1) to M3(4) serially coupled to the plurality of second transistors M2(1) to M2(4) and the operational amplifier AMP so that it is possible to obtain a desirable current value.

As described above, according to the current range control circuit, the data driver, and the organic light emitting display of the embodiments of the present invention, it is possible to control the range of the data currents output from the data driver according to the current range control signal. Therefore, it is also possible to apply the same current range control circuit to various pixel circuits and electroluminescent devices by changing the current range control signals.

Also, using the current range control circuit of the present invention, it is possible to control the range of currents and to make the drain voltages of the transistors that form a current mirror structure equal to each other so that it is possible to obtain the desired current values.

Although exemplary embodiments of the present invention have been shown and described, it would be appreciated by those skilled in the art that changes might be made to these embodiments without departing from the principles and spirit of the invention, the scope of which is defined in the claims and their equivalents.

What is claimed is:

1. An organic light emitting display comprising:

a scan driver for sequentially applying scan signals to scan lines;

a data driver for applying data currents to data lines, a range of the data currents being proportionally increased and decreased by current range control signals; and a pixel portion for displaying images in response to the scan signals and the data currents.

2. The organic light emitting display of claim 1, wherein a scan driver control signal is transmitted to the scan driver.

3. An organic light emitting display comprising, a scan driver for sequentially applying scan signals to scan lines;

a data driver for applying data currents to data lines, a range of the data currents being proportionally increased or decreased by current range control signals; and a pixel portion for displaying images in response to the scan signals and the data currents, wherein data signals are supplied to the data driver, the data signals including video data being supplied to the organic light emitting display, and wherein the data driver includes:

a shift register for outputting a latch control signal in response to a clock signal and a synchronizing signal;

a data latch for sequentially receiving the video data in response to a latch control signal and for outputting the video data in parallel as parallel video data;

a digital to analog converter for converting the parallel video data into analog currents and for outputting the analog currents; and a current range control circuit for receiving the analog currents and the current range control signals and for outputting the data currents proportional to the analog currents to the pixel portion.

4. The organic light emitting display of claim 3, wherein values of the data currents are proportional to values of the analog currents output from the digital to analog converter through proportionality constants, and wherein the current range control signals determine the proportionality constants.

5. The organic light emitting display of claim 3, wherein the current range control circuit comprises:

a current mirror circuit including a first transistor, the first transistor having a first transistor source, a first transistor drain, and a first transistor gate, and second transistors coupled to the first transistor, each of the second transistors forming a current mirror with the first transistor; and a switching circuit for selectively transmitting drain currents of the second transistors in response to the current range control signals to obtain transmitted drain currents and adding together the transmitted drain currents to obtain each one of the data currents.

6. The organic light emitting display of claim 5, wherein the current range control circuit further comprises a negative feedback circuit for making a drain voltage of the first transistor equal to drain voltages of the second transistors.

7. The organic light emitting display of claim 6, wherein the negative feedback circuit comprises:

third transistors having sources coupled to the second transistors and having drains coupled to the switching circuit to transmit the drain currents of the second transistors to the switching circuit; and an operational amplifier having a positive input port, a negative input port, and an output port, the positive input port being coupled to the first transistor drain, the negative input port being coupled to a drain of one of the second transistors, and the output port being coupled to gates of the third transistors.

8. The organic light emitting display of claim 7, wherein the negative feedback circuit further comprises a capacitor coupled between the output port and the negative input port of the operational amplifier.

9. The organic light emitting display of claim 5, wherein the analog currents output from the digital to analog converter are applied to the first transistor drain, wherein the first transistor drain and the first transistor gate are electrically coupled to each other, wherein gates of the second transistors are electrically coupled to the first transistor gate, and wherein sources of the second transistors are electrically coupled to the first transistor source.

10. The organic light emitting display of claim 5, wherein the switching circuit comprises fourth transistors, each of the fourth transistors corresponding to one of the second transistors, wherein the drain currents of the second transistors are applied to sources of corresponding ones of the fourth transistors, wherein the current range control signals are applied to gates of the fourth transistors, and wherein drains of the fourth transistors are coupled to one another to output the data currents.

11. The organic light emitting display of claim 5, wherein the switching circuit comprises fourth transistors, each of the fourth transistors corresponding to one of the second transistors, wherein the drain currents of the second transistors are applied to sources of a corresponding one of the fourth transistors, wherein a first voltage is applied to a gate of one transistor among the fourth transistors to turn on the one transistor, wherein the current range control signals are applied to gates of remaining transistors among the fourth transistors, and wherein drains of the fourth transistors are coupled together to output the data currents.

* * * * *